(12) United States Patent
Mehrad et al.

(10) Patent No.: US 8,062,966 B2
(45) Date of Patent: Nov. 22, 2011

(54) METHOD FOR INTEGRATION OF REPLACEMENT GATE IN CMOS FLOW

(75) Inventors: Freido Mehrad, Plano, TX (US); James J. Chambers, Dallas, TX (US); Shaofeng Yu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 165 days.

(21) Appl. No.: 12/647,074

(22) Filed: Dec. 24, 2009

(65) Prior Publication Data
US 2010/0164008 A1    Jul. 1, 2010

Related U.S. Application Data

(60) Provisional application No. 61/141,723, filed on Dec. 31, 2008.

(51) Int. Cl.
*H01L 21/8238* (2006.01)
*H01L 27/092* (2006.01)

(52) U.S. Cl. ............... 438/592; 257/369; 257/E27.062; 257/204; 257/E21.635; 438/229; 438/153; 438/188; 438/199; 438/240

(58) Field of Classification Search ............... 257/204, 257/274, 360–380, E27.062–E27.067, E27.108, 257/E21.63–E21.644; 438/153, 188, 199–240, 438/592
See application file for complete search history.

(56) References Cited

U.S. PATENT DOCUMENTS

2007/0037343 A1* 2/2007 Colombo et al. ............ 438/231
2009/0186458 A1* 7/2009 Yu et al. ...................... 438/233

* cited by examiner

*Primary Examiner* — Fernando L Toledo
*Assistant Examiner* — Mamadou Diallo
(74) *Attorney, Agent, or Firm* — Wade J. Brady, III; Frederick J. Telecky, Jr.

(57) ABSTRACT

Semiconductor devices and fabrication methods are provided, in which metal transistor replacement gates are provided for CMOS transistors. The process provides dual or differentiated work function capability (e.g., for PMOS and NMOS transistors) in CMOS processes.

20 Claims, 12 Drawing Sheets

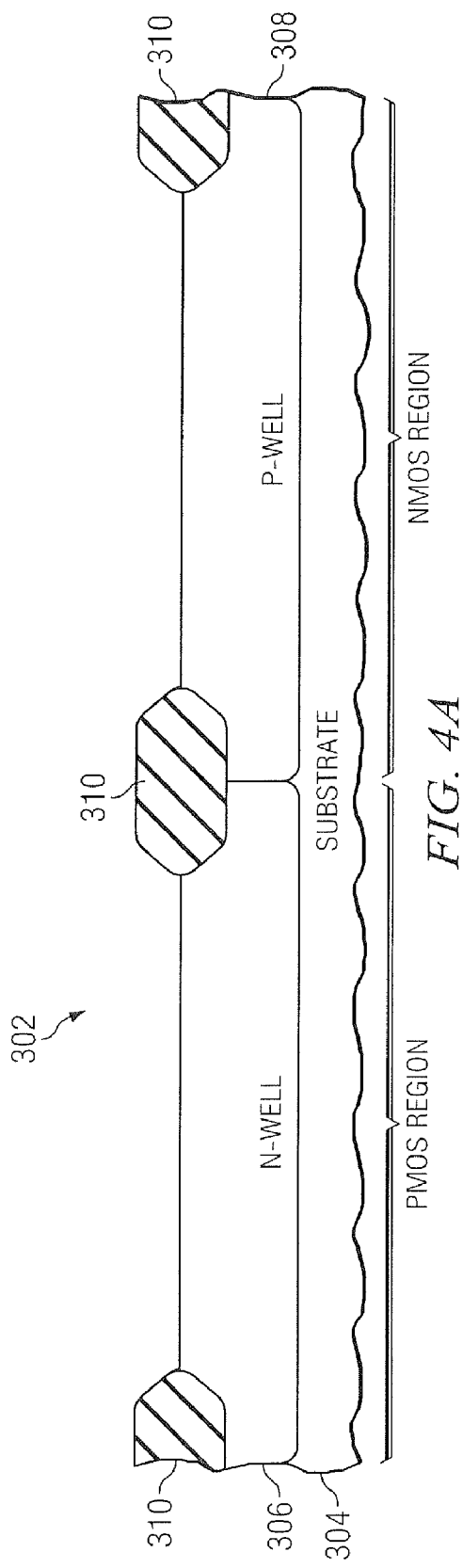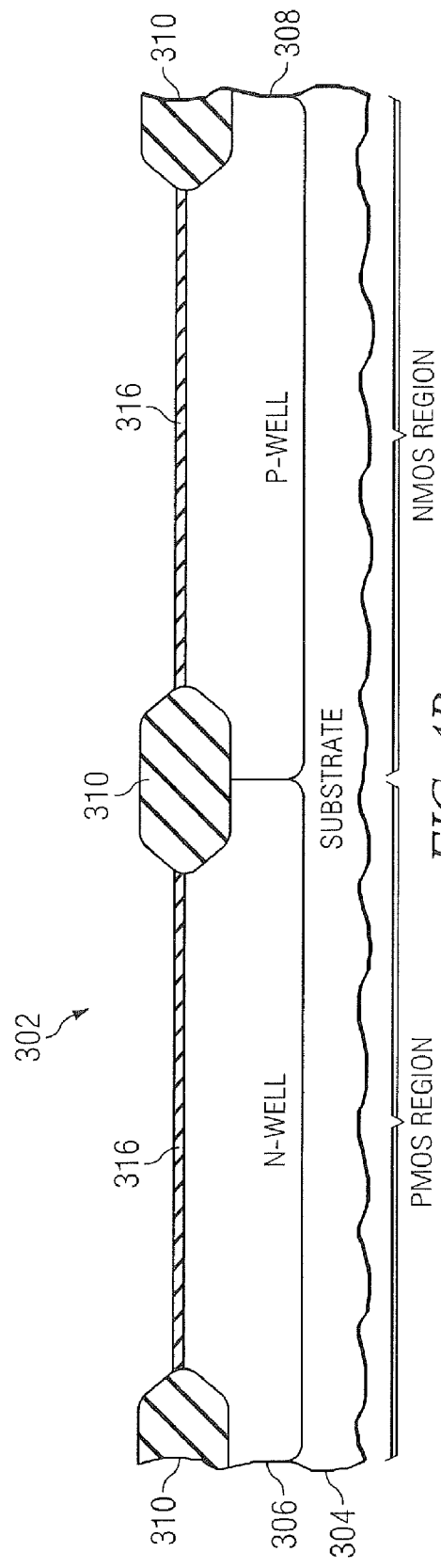

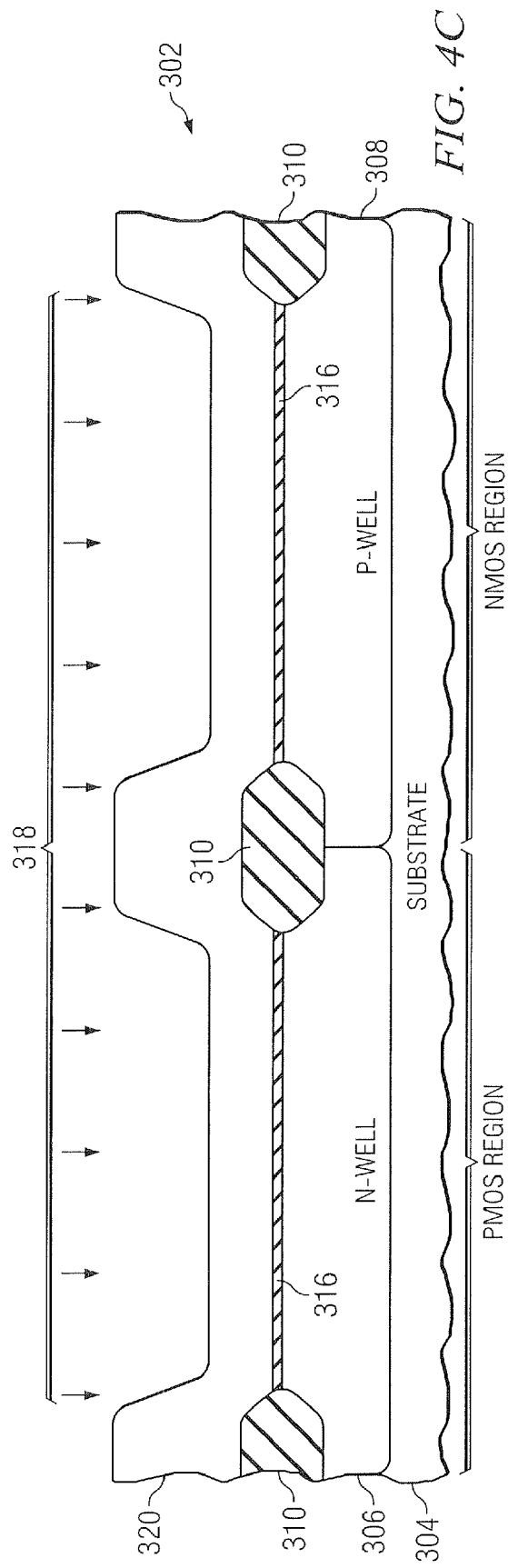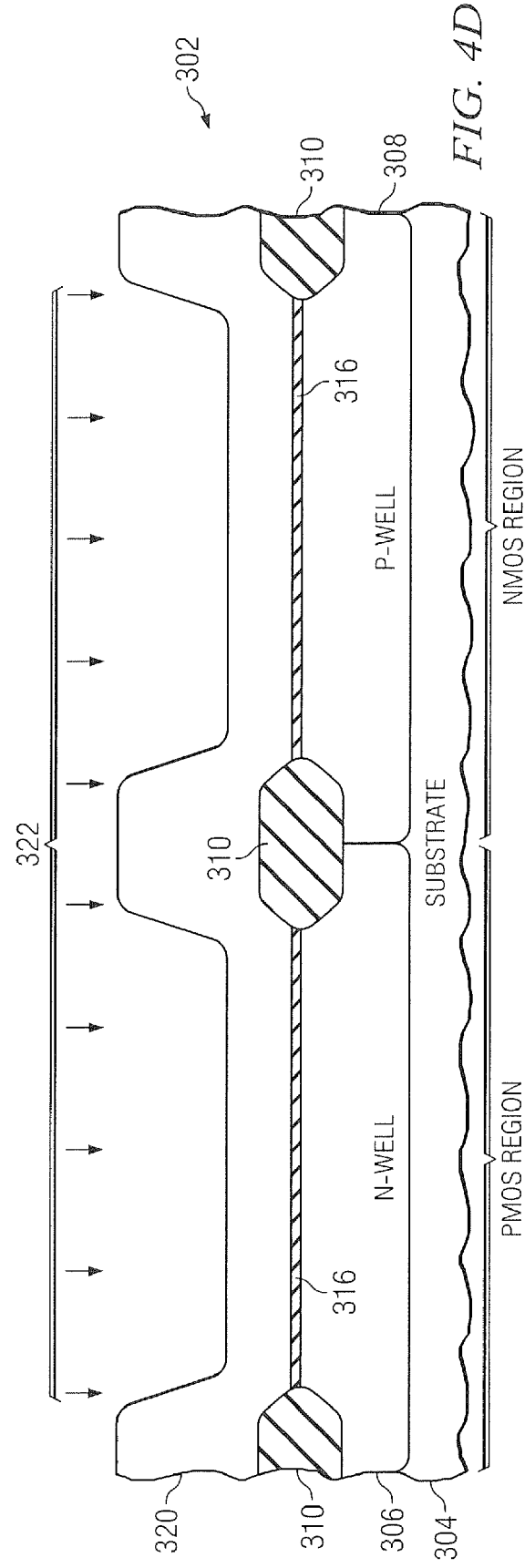

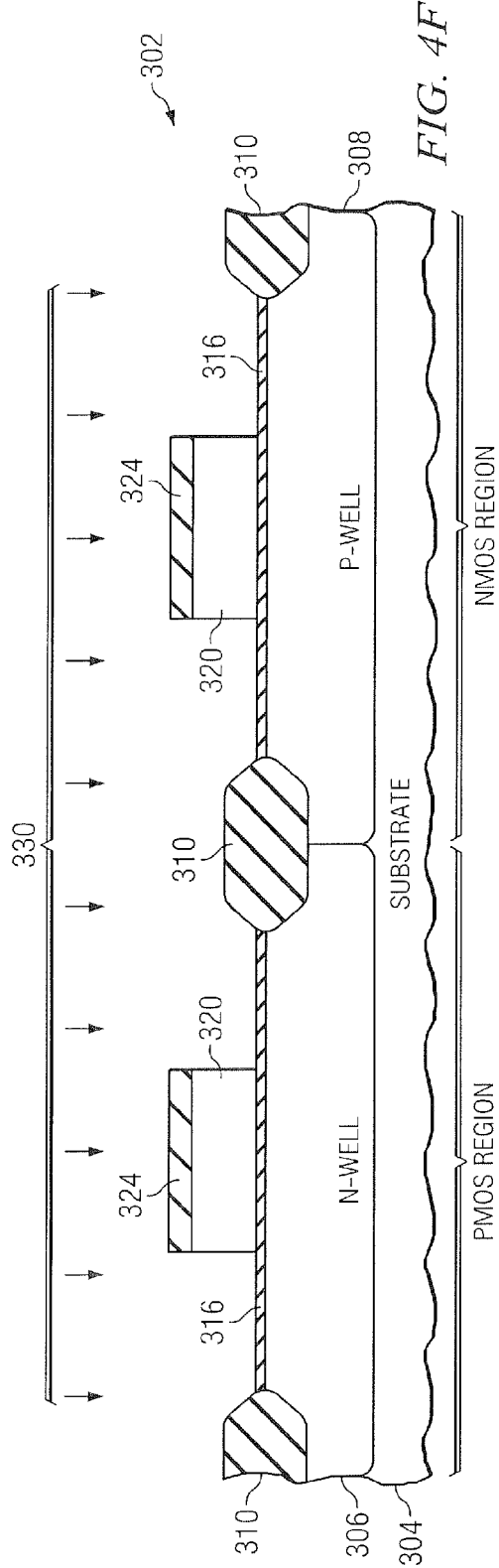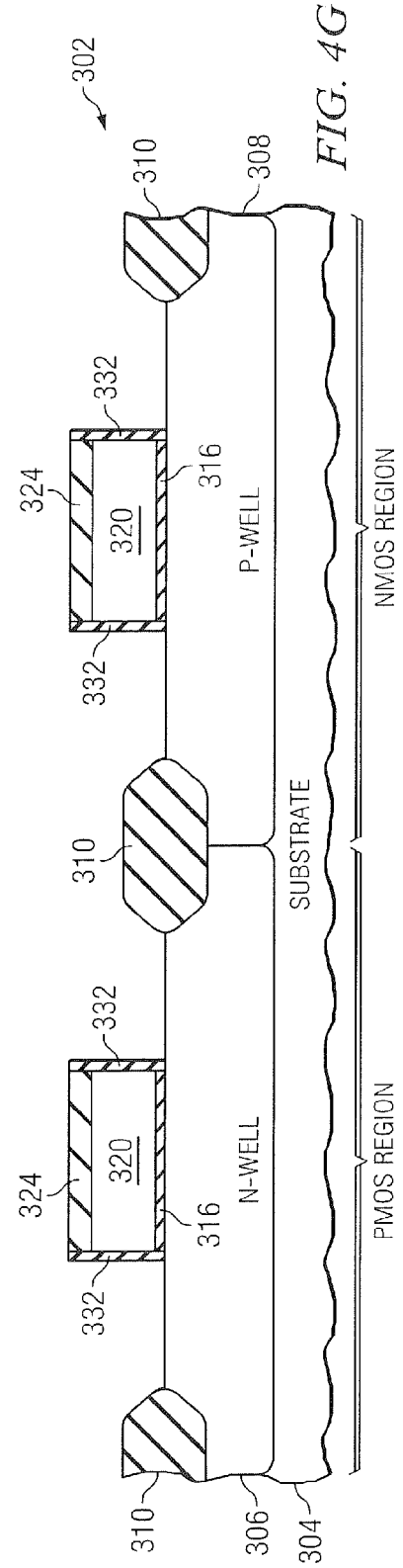

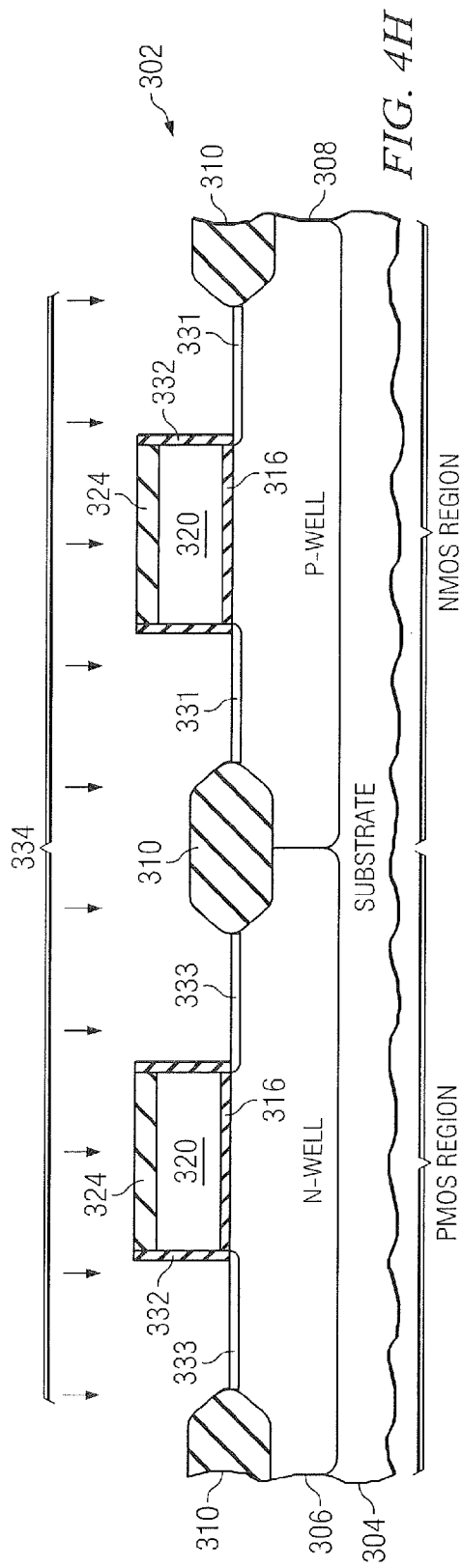
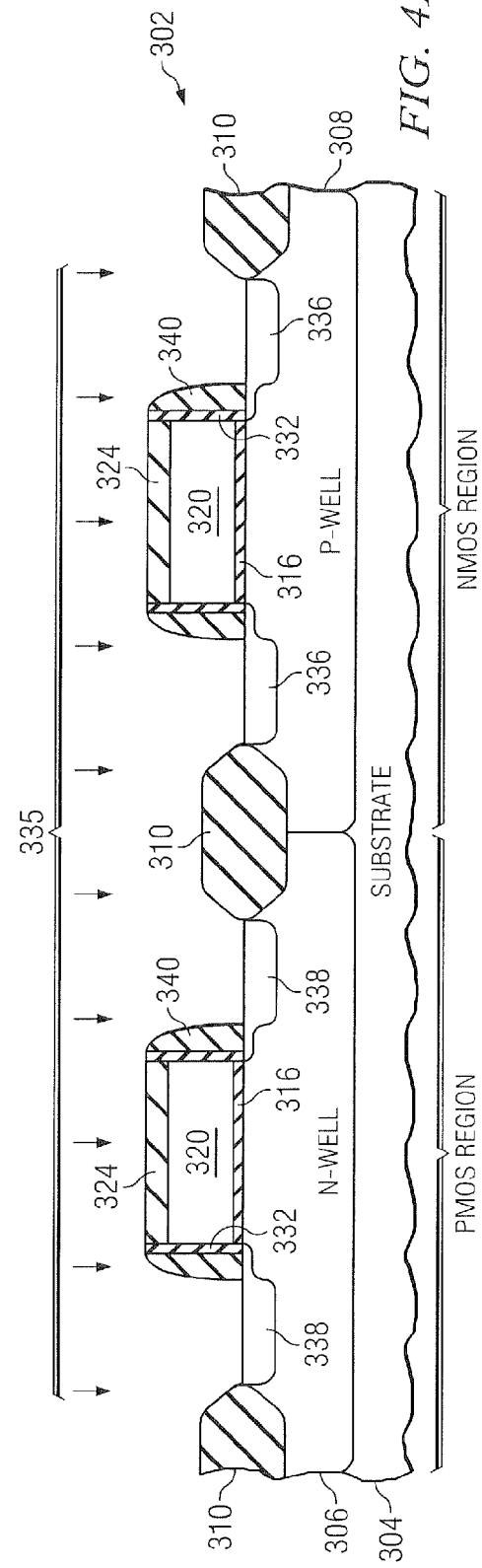

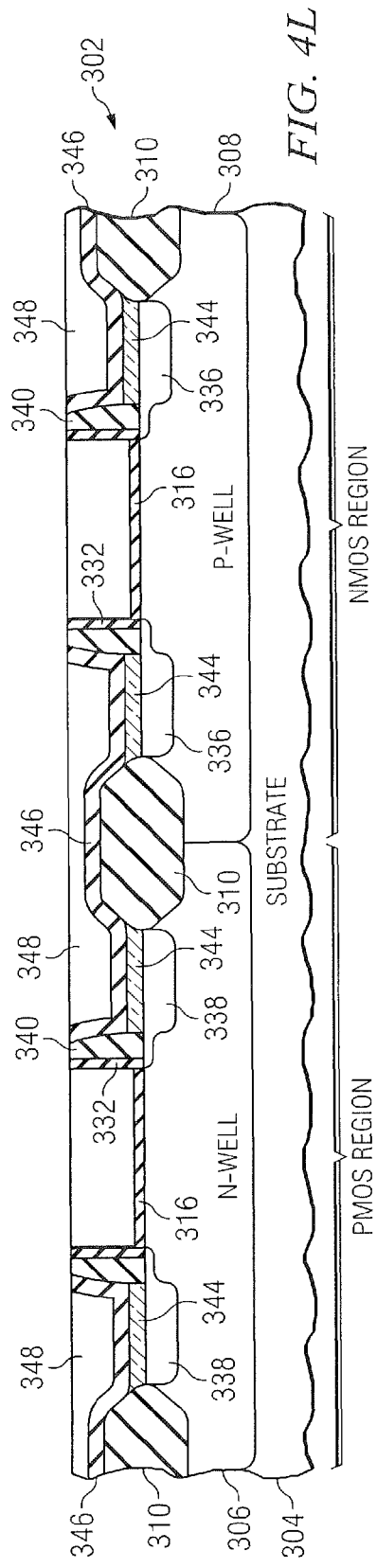
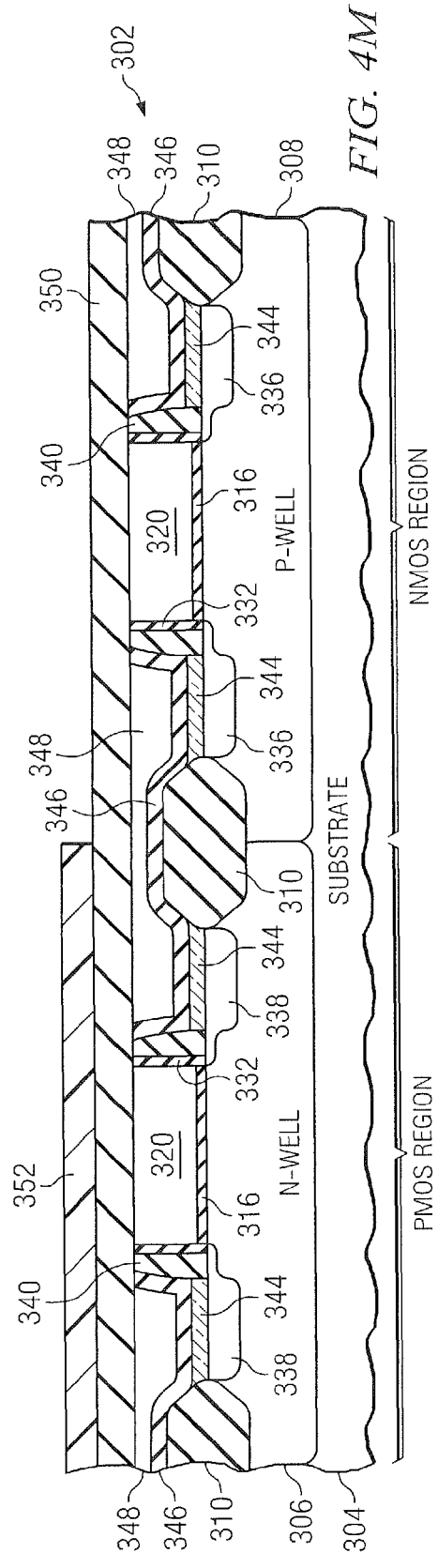

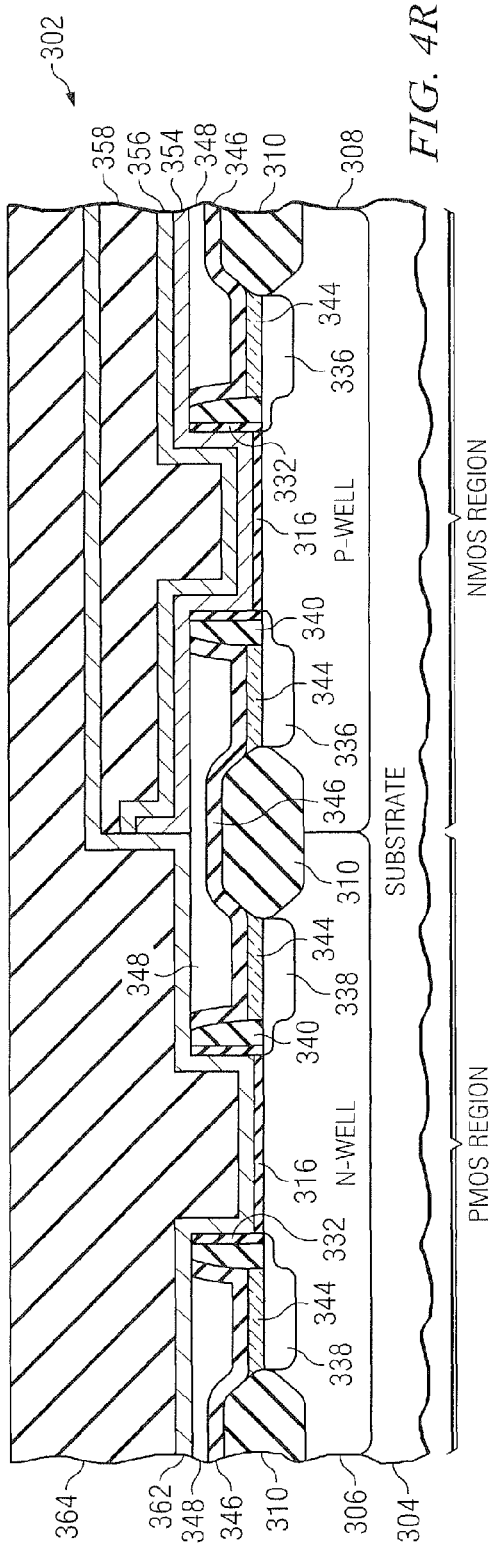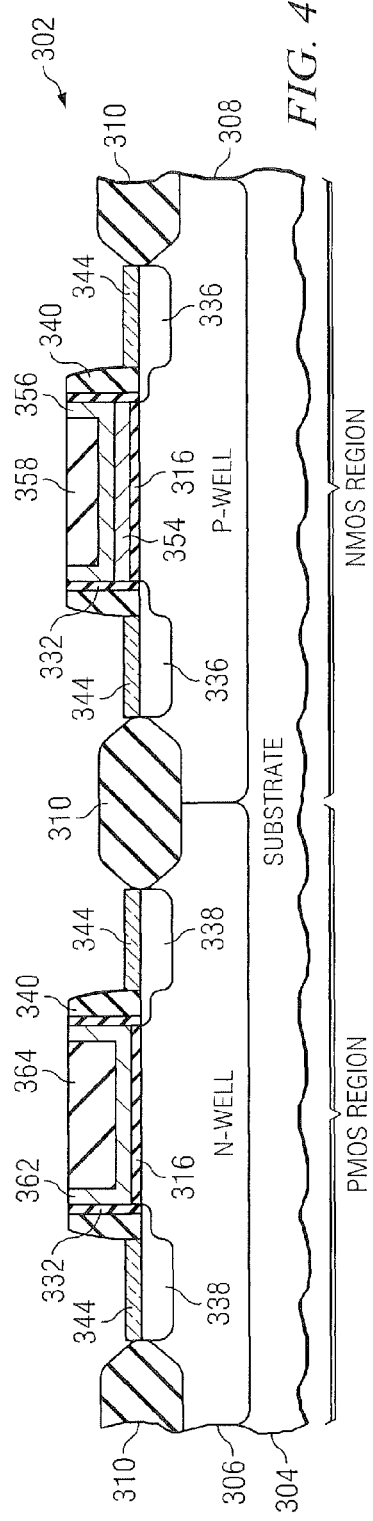

METHOD FOR INTEGRATION OF REPLACEMENT GATE IN CMOS FLOW

This is a non-provisional of Application No. 61/141,723 filed Dec. 31, 2008, the entirety of which is incorporated herein by reference.

FIELD OF INVENTION

The invention relates generally to semiconductor devices and more particularly to integrated circuits including metal gate MOS transistor devices and fabrication methods for making the same.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFETs), wherein a gate electrode is energized to create an electric field in a channel region of a semiconductor body, by which electrons are allowed to travel through the channel between a source region and a drain region of the semiconductor body. The source and drain regions are typically formed by adding dopants to targeted regions on either side of the channel. A gate dielectric or gate oxide is formed over the channel, and a gate electrode or gate contact is formed over the gate dielectric. The gate dielectric and gate electrode layers are then patterned to form a gate structure overlying the channel region of the substrate.

In operation of the resulting MOS transistor, the threshold voltage (Vt) is the gate voltage value required to render the channel conductive by formation of an inversion layer at the surface of the semiconductor channel. Complementary MOS (CMOS) devices have become widely used in the semiconductor industry, wherein both n-channel and p-channel (NMOS and PMOS) transistors are used to fabricate logic and other circuitry. For enhancement-mode (e.g., normally off) devices the threshold voltage Vt is positive for NMOS and negative for PMOS transistors. The threshold voltage is dependent upon the flat-band voltage, where the flat-band voltage depends on the work function difference between the gate and the substrate materials, as well as on surface charge.

The work function of a material is a measure of the energy required to move an electron in the material outside of a material atom from the Fermi level, and is usually expressed in electron volts (eV). For CMOS products, it is desirable to provide predictable, repeatable, and stable threshold voltages (Vt) for the NMOS and PMOS transistors. To establish Vt values, the work functions of the PMOS and NMOS gate contact and the corresponding channel materials are independently tuned or adjusted through gate and channel engineering, respectively.

Gate stack engineering is employed to adjust the work function of the gate contact materials, where different gate work function values are set for PMOS and NMOS gates. The need to independently adjust PMOS and NMOS gate work functions has made polysilicon attractive for use as a gate contact material in CMOS processes, since the work function of polysilicon can be easily raised or lowered by doping the polysilicon with p-type or n-type impurities, respectively. The PMOS polysilicon gates are typically doped with p-type impurities and the NMOS polysilicon gates are typically doped with n-type dopants, typically during implantation of the respective source/drain regions following gate patterning. In this way, the final gate work functions are typically near the Si conduction band edge for NMOS and near the valence band edge for PMOS. The provision of dopants into the polysilicon also has the benefit of increasing the conductivity of the gate electrode. Polysilicon has thus far been widely used in the fabrication of CMOS devices, wherein the gate engineering provides a desired gate electrode conductivity (e.g., sheet resistance value) by conventional tuning (e.g., implants), and the threshold voltage fine tuning is achieved by tailoring the channel doping level through the Vt adjust implants.

FIG. 1 illustrates a conventional CMOS fabrication process 10 beginning at 12, in which front-end processing is performed at 14, including well formation and isolation processing. At 16 and 18, channel engineering is performed (e.g., Vt adjust, punch-thru, and channel stop implants) for PMOS and NMOS regions, respectively. A thin gate dielectric and an overlying polysilicon layer are formed at 20 and 22, respectively, and the polysilicon is patterned at 24 to form gate structures for the prospective NMOS and PMOS transistors. The gate structures are then encapsulated at 26, typically through oxidation, and highly-doped drain (HDD) implants are performed at 28 to provide p-type dopants to prospective source/drains of the PMOS regions and n-type dopants to source/drains of the NMOS regions, using the patterned gate structures and isolation structures as an implantation mask. Sidewall spacers are then formed at 30 along the lateral sidewalls of the gate structures.

At 32, the PMOS source/drain regions and the PMOS polysilicon gate structures are implanted with p-type dopants to further define the PMOS source/drains, and to render the PMOS gates conductive. Similarly, the NMOS source/drain regions and the NMOS polysilicon gate structures are implanted at 34 with n-type dopants, further defining the NMOS source/drains and rendering the NMOS gates conductive. Thereafter, the source/drains and gates are silicided at 36 and back-end processing (e.g., interconnect metalization, etc.) is performed at 38, before the process 10 ends at 40. In the conventional process 10, the channel engineering implants at 16 and 18 shift the Vt of the PMOS and NMOS channel regions, respectively, to compensate for the changes in the PMOS and NMOS polysilicon gate work functions resulting from the source/drain implants at 32 and 34, respectively. In this manner, the desired work function difference between the gates and channels may be achieved for the resulting PMOS and NMOS transistors, and hence the desired threshold voltages.

The gate dielectric or gate oxide between the channel and the gate electrode is an insulator material, typically $SiO_2$ or other dielectric, that operates to prevent current from flowing from the gate electrode into the channel when a voltage is applied to the gate electrode. The gate dielectric also allows an applied gate voltage to establish an electric field in the channel region in a controllable manner. Continuing trends in semiconductor product manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate dielectric that is formed over the semiconductor surface.

However, there are electrical and physical limitations on the extent to which $SiO_2$ gate dielectrics can be made thinner. These include gate leakage currents tunneling through the thin gate oxide, limitations on the ability to form very thin oxide films with uniform thickness, and the inability of very thin SiO$_2$ gate dielectric layers to prevent dopant diffusion from the gate polysilicon into the underlying channel. Accordingly, recent scaling efforts have focused on high-k dielectric materials having dielectric constants greater than that of SiO$_2$, which can be formed in a thicker layer than scaled SiO$_2$, and yet which produce equivalent field effect performance. A thicker high-k dielectric layer can thus be formed to avoid or mitigate tunneling leakage currents, while still achieving the required electrical performance equivalent (e.g., capacitance value) to a thinner SiO$_2$.

It has also been proposed to utilize hafnium-based high-k dielectric materials in combination with a lanthanide series metal to lower the work function of metal gates. The lanthanide series metal is provided as a distinct surface layer over the high-k dielectric material. This proposal, however, increases the overall equivalent oxide thickness (EOT) of the layer of gate oxide.

Another shortcoming of scaled CMOS devices having polysilicon gate contacts is known as polysilicon depletion. Polysilicon depletion occurs when annealing or other thermal back-end processing following the implants at 32 and 34 is insufficient to drive enough implanted impurities down the entire depth of the polysilicon gate structures. In this situation, with this limited doping concentration and under the proper biasing of the gate, a bottom portion of the polysilicon gate contact near the gate dielectric is "depleted" of charges, and acts as an insulator. The depleted portion of the gate contact and the gate dielectric operate as series connected capacitors, resulting in a reduced effective gate capacitance, which reduces the drive current capability of the device. Consequently, polysilicon depletion causes reduction in device performance which leads to poor unscalable devices. Simply increasing the implant energy and/or anneal time to combat polysilicon depletion has adverse results, in that the corresponding depths of the concurrently implanted source/drain regions are increased.

With the relatively thick gate dielectrics and gate electrode structures of the past, polysilicon depletion was not critical to ensuring desired device performance. However, as gate dielectrics and gate electrodes continue to become smaller through scaling, the polysilicon depletion problem is more pronounced, wherein polysilicon depletion regions of 3 to 4 angstroms become a significant fraction of the overall effective gate thickness. Thus, while polysilicon gate electrodes have previously offered flexibility in providing dual work functions at the band edges for CMOS processes, the future viability of conventional polysilicon gate technology is lessened as scaling efforts continue. Accordingly, attention has recently been directed again to the possibility of using metal gate electrodes in CMOS products.

SUMMARY OF THE INVENTION

There remains a need for dual or differentiated work function capability (e.g., for PMOS and NMOS transistors) in CMOS processes. In this regard, metal work functions are not shifted as easily by the same amounts as was the case for polysilicon. Accordingly, there is a need for improved CMOS transistor gate designs and fabrication techniques by which the benefits of scaling can be achieved while avoiding or mitigating the polysilicon depletion degradation found in conventional devices and without increasing EOT.

In one embodiment, the invention is directed to a method of fabricating PMOS and NMOS metal replacement gate structures in a semiconductor device, in which disposable gate structures are formed over a gate dielectric in PMOS and NMOS regions of a semiconductor body. A bis (tertiarybutylamino) silane (BTBAS) layer is then formed over the disposable gate structures, followed by planarization of the BTBAS layer to expose a top portion of the disposable gate structures. The disposable gate structures are then removed in the NMOS region to expose the gate dielectric in the NMOS region. An NMOS metal capping layer is formed over the PMOS and NMOS regions, followed by formation of an NMOS first metal over the metal capping layer over the gate dielectric in the NMOS region. A conductive first gap fill layer is then formed over the NMOS first metal in the NMOS region and disposable gate structures are removed in the PMOS region to expose the gate dielectric in the PMOS region. A PMOS second metal is formed over the gate dielectric in the PMOS region and a conductive second gap fill layer is formed over PMOS second metal in PMOS region.

In a further embodiment, the invention is directed to a method of fabricating PMOS and NMOS metal replacement gate structures in a semiconductor device in which disposable gate structures are formed over a gate dielectric in both PMOS and NMOS regions. A BTBAS layer is then formed over the disposable gate structures in the PMOS and NMOS regions, followed by planarization of the BTBAS layer to exposing a top portion of the disposable gate structures in the PMOS and NMOS regions. The PMOS region is then masked and disposable gate structures are removed to form a cavity having a gate dielectric exposed therein at a bottom thereof in the NMOS region. An NMOS metal capping layer is formed over the exposed gate dielectric in the bottom of the cavity in the NMOS region and an NMOS first metal is formed over the metal capping layer. A conductive first gap fill layer is then formed over the NMOS first metal to fill the cavity in the NMOS region. The NMOS region is then masked and the disposable gate structure in the PMOS region is removed to form a cavity having a gate dielectric exposed therein at a bottom portion thereof in the PMOS region. A PMOS second metal is then formed over the gate dielectric in the PMOS region and a conductive second gap fill layer is formed over the PMOS second metal in PMOS region.

In a still further embodiment, the invention is directed to a method of fabricating PMOS and NMOS metal replacement gate structures in a semiconductor device in which polysilicon disposable gate structures having an insulative hardmask thereover over a gate dielectric in PMOS and NMOS regions of a semiconductor body are formed, followed by formation of source/drain regions in the source/drain areas in the PMOS and NMOS regions. The source/drain regions are then silicided in the PMOS and NMOS regions while the insulative hardmask remains in place to prevent silicidation of the polysilicon gate structures in the PMOS and NMOS regions. A layer of BTBAS is then formed over the silicided source/drain regions and over the polysilicon disposable gate structures in the PMOS and NMOS regions, and the PMOS region is masked to perform a dry etch, thereby removing a first portion of the polysilicon disposable gate structure in the NMOS region. The BTBAS layer protecting the underlying silicided source/drain regions in the NMOS region is removed during a following wet etch. The remaining portion of the polysilicon disposable gate structure in the NMOS region is removed by wet etch to generate a cavity, exposing the gate dielectric at a bottom portion thereof in the NMOS region. A metal capping layer is then formed over the exposed gate dielectric in the bottom of the cavity in the NMOS region, followed by formation of a first NMOS metal over the capping layer in the cavity. The cavity is then filled with a conductive first gap fill layer. The NMOS region is masked and a dry etch performed to remove a first portion of the polysilicon disposable gate structure in the PMOS region, with the BTBAS layer protecting the underlying silicided source/drain regions in the PMOS region during the wet etch which follows. The wet etch removes the remaining portion of the polysilicon disposable gate structure in the PMOS region, thereby generating a cavity and exposing the gate dielectric at a bottom portion in the PMOS region. A PMOS second metal is formed over the gate dielectric in the PMOS region followed by formation of a conductive second gap fill layer over the PMOS second metal in PMOS region.

DETAILED DESCRIPTION

Figure 1:
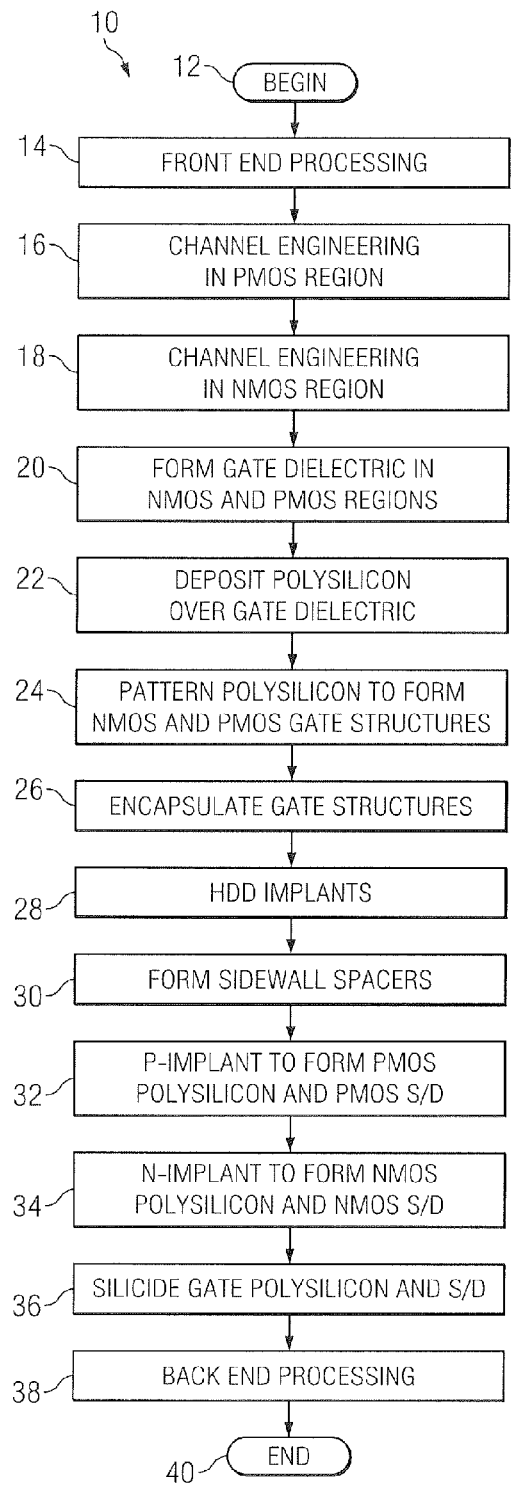
FIG. 1 is a simplified flow diagram illustrating a conventional polysilicon gate CMOS fabrication process including channel engineering for both PMOS and NMOS transistors.

One or more implementations of the invention are described with reference to the attached drawings, wherein like reference numerals are used to refer to like elements throughout, and wherein the illustrated structures are not necessarily drawn to scale. The invention relates to metal replacement gate CMOS devices and fabrication methods. The invention may be employed to simplify channel engineering steps in particular, and fabrication processing generally, while mitigating or eliminating the capacitance depletion shortcomings of conventional CMOS devices.

In the described implementations, metal nitride is formed above a gate dielectric in the NMOS and PMOS regions, wherein these and the gate dielectric may be formed by separate processes for the NMOS and PMOS regions. As used herein, metal nitrides are any materials comprising metal and nitrogen content, including but not limited to metal nitrides, metal silicon nitrides, metal aluminum nitrides, and metal aluminum silicon nitrides. In the examples illustrated and described herein, moreover, a single metal nitride starting material may be concurrently formed above the gate dielectric in both the NMOS region and the PMOS region, for example, using a replacement gate process.

The example implementations are described using disposable/replacement gates in the formation of the transistor structure. Disposable gates provide advantages in processing, such as not subjecting the permanent gate to harmful processing parameters. However, the principles of the invention described herein can also be practiced on transistor fabrication processes not using disposable gates.

Figure 2:
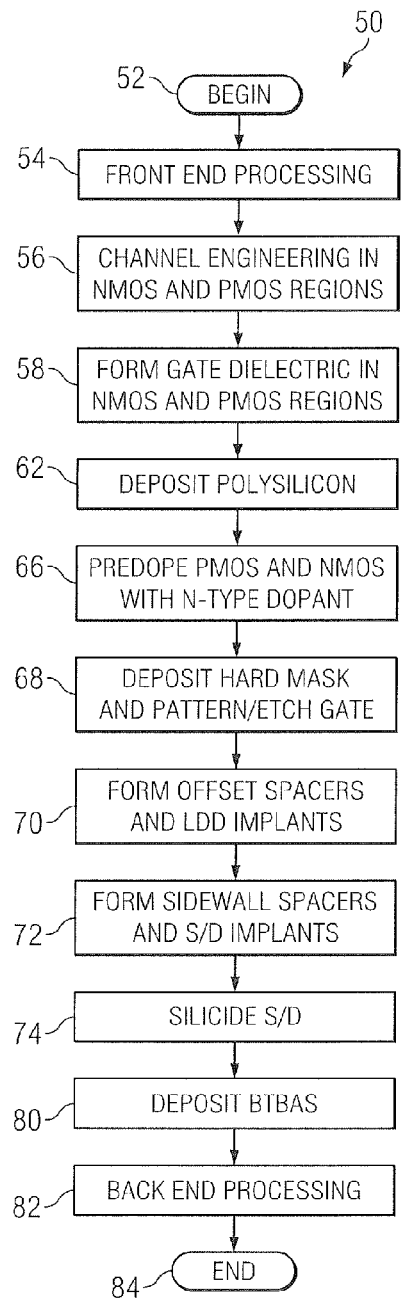
FIG. 2 is a flow diagram illustrating an example method of fabricating an integrated circuit semiconductor device including a metal gate electrode, utilizing a replacement gate in accordance with an aspect of the invention.
Figure 3:
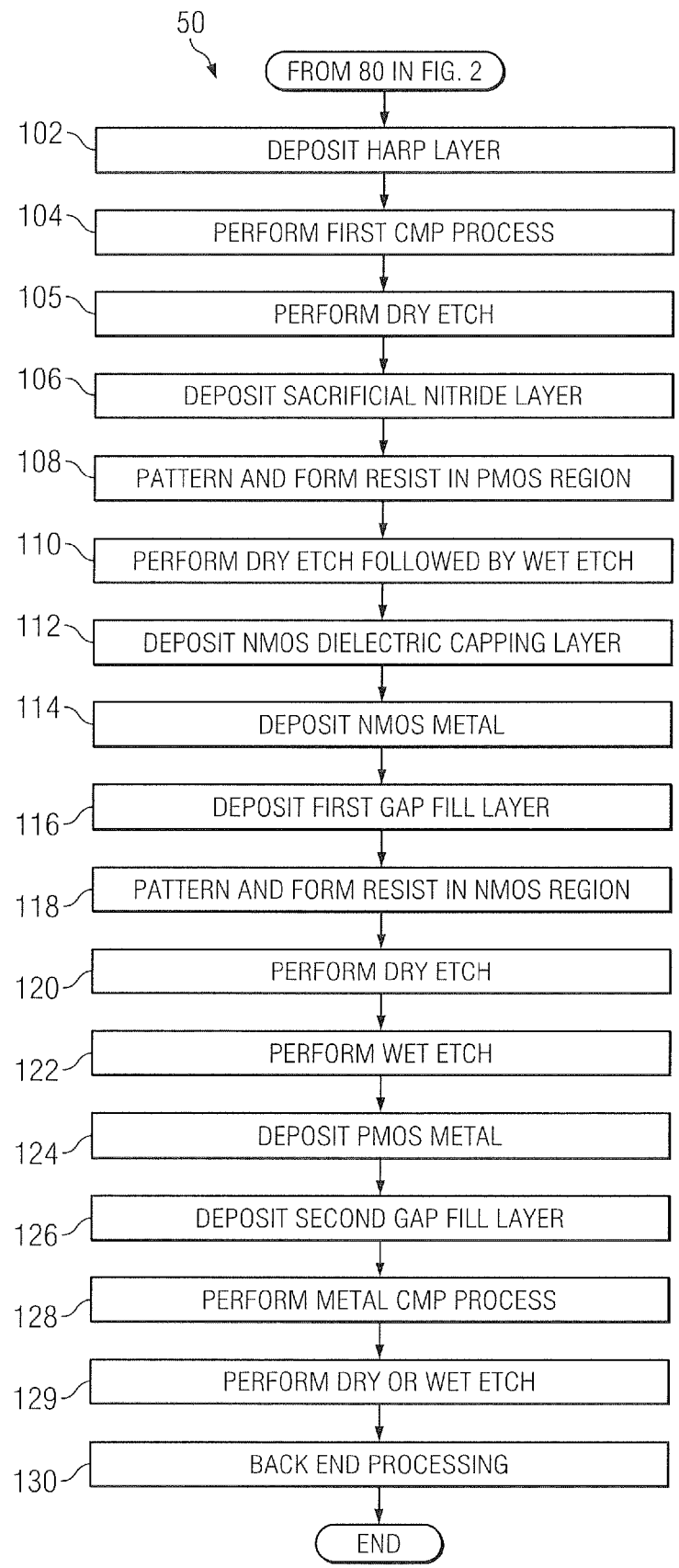
FIG. 3 is a flow diagram illustrating various techniques for forming tuned PMOS and NMOS metal gate structures with differentiated work functions in the fabrication method of FIG. 2.

Referring initially to FIGS. 2-3, an example method 50 is illustrated in FIG. 2 for fabricating integrated circuit semiconductor devices including metal gate structures for PMOS and NMOS transistors in accordance with the invention. FIG. 3 illustrates various example implementations of steps of the method 50 relating to creation of gate structures with differentiated work functions using a single starting material. While the example method 50 is illustrated and described below as a series of acts or events, it will be appreciated that the invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the invention. Further, the methods according to the invention may be implemented in association with the formation and/or processing of structures illustrated and described herein, as well as in association with other structures and devices not illustrated.

The method 50 begins at 52 in FIG. 2, wherein front-end processing is performed at 54. The front-end processing may be any front-end processing, and may include, for example, formation of n-wells and p-wells using diffusion, implantation, or other suitable processing steps, as well as formation of isolation structures in field regions of a device wafer using local oxidation of silicon (LOCOS), shallow trench isolation (STI), or any other suitable isolation processing. While the figures show use of LOCOS field oxide (FOX) type isolation structures, shallow trench isolation (STI) or other type isolation structures may also be employed and are contemplated within the scope of the invention. The methods and devices of the invention may be implemented using any type of semiconductor body, including but not limited to bulk semiconductor wafers (e.g., silicon), epitaxial layers formed over a bulk semiconductor, silicon-on-insulator (SOI) wafers, etc. At 56, channel engineering may be performed in both the NMOS and PMOS regions, such as, for example, threshold voltage adjustment implants, punch-through implants, etc.

At 58, a gate dielectric is formed in the NMOS and PMOS regions using any suitable materials, material thicknesses, and processing steps, including a single thermal oxidation or deposition or combinations thereof to form a gate dielectric above the semiconductor body, which may be a single layer or multiple layers. The invention may be employed in conjunction with gate dielectric materials formed from high-k dielectrics, including but not limited to binary metal oxides including aluminum oxide ($Al_2O_3$), zirconium oxide ($ZrO_2$), hafnium oxide ($HfO_2$), lanthanide oxides (e.g., $La_2O_3$, $Yb_2O_3$), yttrium oxide ($Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanide oxynitrides (e.g., LaON, YbON), yttrium oxynitride (YON), as well as their silicates and aluminates such as ZrSiON, HfSiON, LaSiON, YSiON, etc.; perovskite-type oxides including titanate system materials such as barium titanate, strontium titanate, barium strontium titanate (BST), lead titanate, lead zirconate titanate, lead lanthanum zirconate titanate, barium lanthanum titanate, barium zirconium titanate; niobate or tantalate system materials such as lead magnesium niobate, lithium niobate, lithium tantalate, potassium niobate, strontium aluminum tantalate and potassium tantalum niobate; tungsten-bronze system materials such as barium strontium niobate, lead barium niobate, barium titanium niobate; and bi-layered perovskite system materials such as strontium bismuth tantalate, bismuth titanate and others. In the examples illustrated and described herein, a single thermal oxidation is performed at 58 to create a thin gate dielectric oxide overlying the substrate in the NMOS and PMOS regions.

Following gate dielectric formation at 58, the method 50 provides for the deposition at 62 of a polysilicon layer in the NMOS and PMOS regions. The polysilicon layer is then pre-doped with an n-type dopant in both the NMOS and PMOS regions at 66. The dopant comprises one or more of phosphorous, arsenic, antimony, or the like.

An insulative hardmask is formed over the NMOS and PMOS regions at 68. The mask may comprise an inorganic material such as an inorganic anti-reflective coating (IARC) nitride or oxynitride material. The gate stack dielectric (hardmask+polysilicon) is then patterned and etched.

Different processing steps may be used at 62 and 66 or some processing operations thereof may be concurrently performed in both the NMOS and PMOS regions within the scope of the invention.

Baseline processing is then continued, where offset spacers and lightly-doped drain (LDD) or highly-doped drain (HDD) implants are added at 70, and sidewall spacers are formed and source/drain (S/D) implants are performed at 72. This is followed by silicidation at 74, which will silicide the S/D regions only, with no silicide formed on top of the polysilicon due to presence of the hardmask.

Referring now to FIGS. 2, 3, and 4A-4S, an example CMOS device 302 is illustrated in FIGS. 4A-4S at various stages of fabrication processing generally according to the method 50. In this example, the gate fabrication for the NMOS and PMOS transistors is illustrated in further detail in FIG. 4A, where the CMOS device 302 includes a silicon substrate semiconductor body 304 with a p-well 308 formed in an NMOS region and an n-well 306 formed in a PMOS region. The device 302 further comprises shallow trench isolation (STI) or field oxide (FOX) isolation structures 310, where the wells 306, 308 and the field oxide 310 are formed during front-end processing (e.g., at 54 in FIG. 2). As illustrated in FIG. 4B, a gate dielectric layer 316 is formed above the substrate 304 in both the NMOS and the PMOS regions (58 in FIG. 2). The gate dielectric layer 316 will be, in one embodiment, from about 5 Angstroms to about 25 Angstroms thick. In FIG. 4C, a layer of polysilicon 320 is deposited over the gate dielectric 316 via a chemical vapor deposition (CVD), atomic layer deposition (ALD), physical vapor deposition (PVD), or other suitable deposition process 318 (62 in FIG. 2) in both the NMOS and PMOS regions. The thickness of the polysilicon layer 320 will be, in one embodiment, from about 400 Angstroms to about 1200 Angstroms.

Figure 4E:
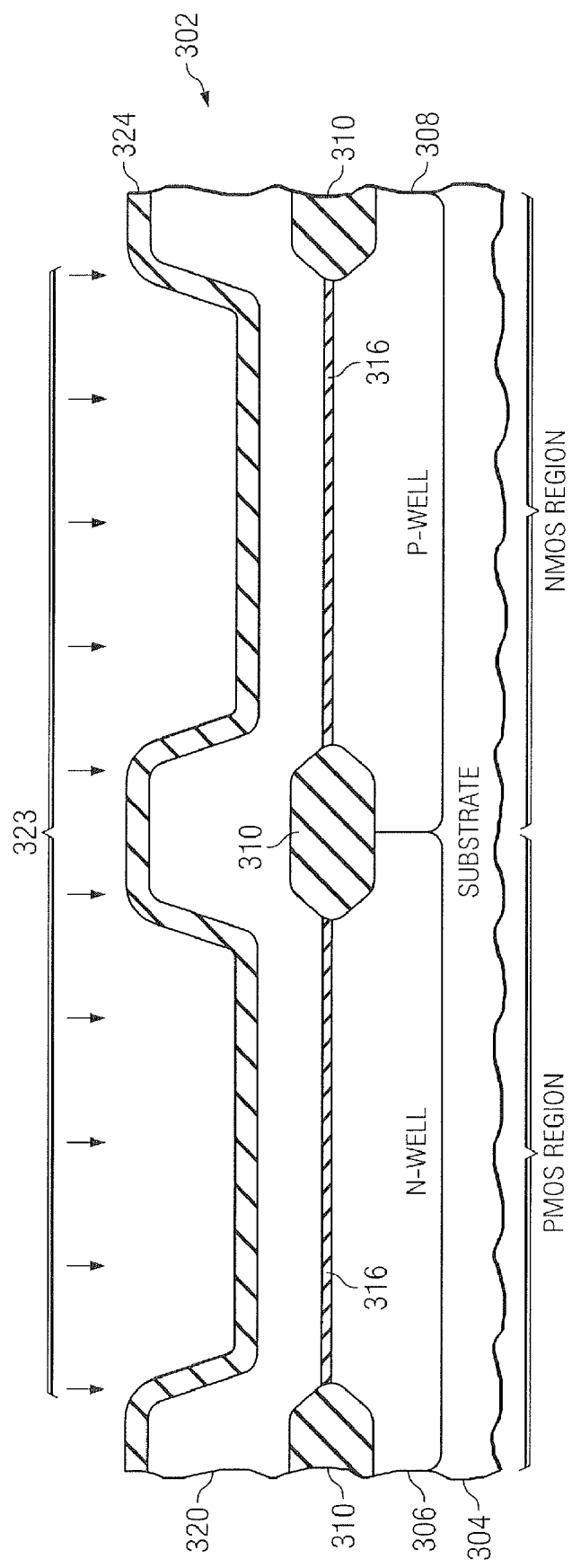
FIGS. 4A-4S are cross-sectional views illustrating example NMOS and PMOS transistors undergoing CMOS metal gate processing in accordance with the invention at various stages of fabrication.

An n-type dopant, for example, phosphorous, arsenic or antimony, is then implanted by an implant 322 in both the NMOS and PMOS regions in FIG. 4D. This is followed by a deposition 323 of an insulative hardmask 324 in FIG. 4E. The thickness of the hardmask 324 will be, in one embodiment, from about 200 Angstroms to about 1000 Angstroms.

In FIG. 4F, the polysilicon 320 and the hardmask 324 are patterned and etched by process 330 to define patterned NMOS and PMOS disposable gate structures with source/drain areas in the semiconductor body on opposing sides thereof. The hardmask 324 can include, for example, a nitride or oxynitride IARC.

A thin layer of oxide is formed on the sidewalls of polysilicon 320 and a thin nitride offset spacer 332 is formed (70 in FIG. 2) as illustrated in FIG. 4G.

Figure 4J:
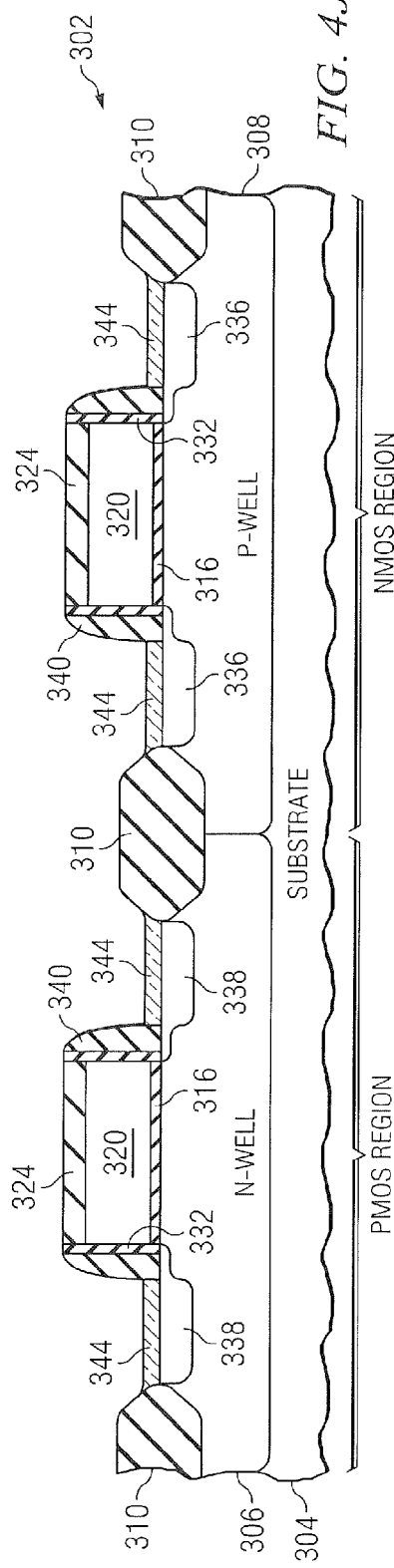

LDD or HDD implants 334 are performed (70 in FIG. 2) in FIG. 4H to introduce p-type dopants into extension regions 331 of prospective NMOS source/drains 336 and to introduce n-type dopants into extension regions 333 of prospective PMOS source/drains 338 (as S/D extensions), with the field oxide 310 and patterned gate structures 320/324 operating as an implantation mask. In FIG. 4I, sidewall spacers 340 of silicon dioxide ($SiO_2$) or silicon nitride ($Si_3N_4$) are formed along lateral sidewalls of the patterned gate structures 320/324 (72 in FIG. 2), and deeper source/drain implants 335 are performed using the field oxide 310, patterned gate structures 320/324 and sidewall spacers 340 as an implantation mask to further define source/drains 336 and 338. Thereafter, self-aligned silicide (salicide) contacts 344 are formed (74 in FIG. 2) over the source/drain regions 336, 338 in FIG. 4J, with the hardmask 324 remaining in place to prevent silicidation of the polysilicon disposable gate structures in the PMOS and NMOS regions.

Figure 4K:
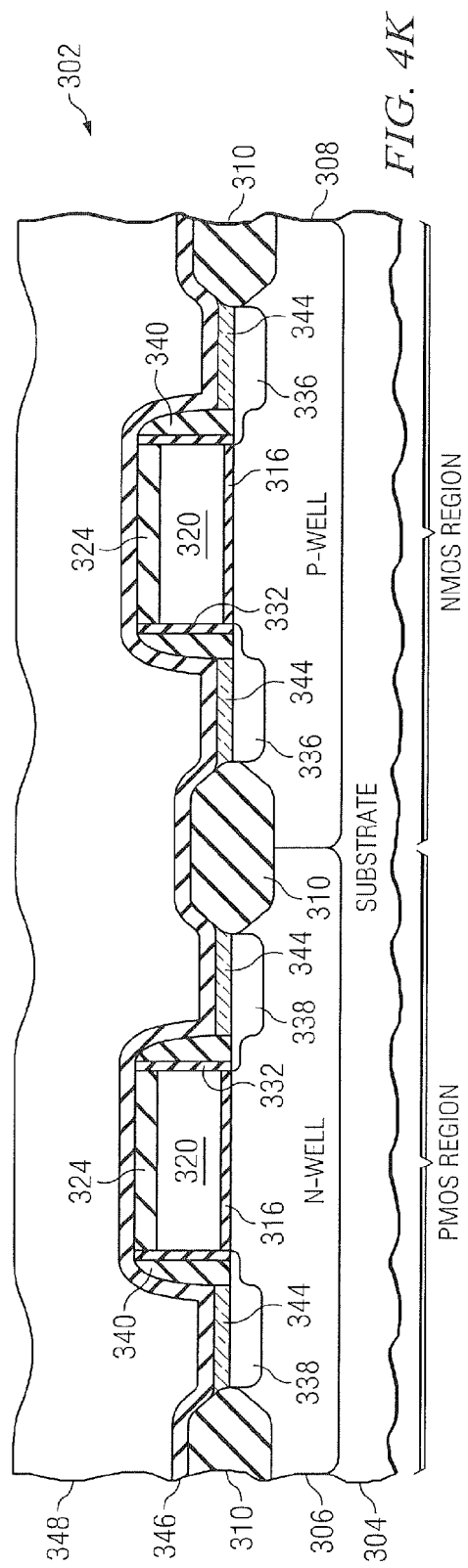

In FIG. 4K, a layer of bis(tertiary-butylamino)silane (BTBAS) 346 is deposited (80 in FIG. 2) over the silicided source/drain regions 336, 338 and over the gate structures and sidewalls in the PMOS and NMOS regions. The BTBAS layer 346 provides a CMP stop layer over the polysilicon 320 for subsequent chemical-mechanical polishing (CMP) processing, as well as protection for the underlying silicided source/drain regions 336, 388 during subsequent wet etching, both described hereinafter. The thickness of the BTBAS layer will be, in one embodiment, from about 20 Angstroms to about 100 Angstroms, and in one embodiment, about 40 Angstroms. A high aspect ratio gap fill layer 348 of dielectric material is deposited (102 in FIG. 3) over the BTBAS layer 346. The gap fill dielectric layer 348 may, for example, be a layer of silicon dioxide ($SiO_2$) deposited using a thermal CVD based on an ozone ($O_3$)/ tetraethyl orthosilicate (TEOS) chemistry, such as employed in the Applied Producer™ HARP™ (High Aspect Ratio Process) of Applied Materials, Inc., San Diego, Calif. (see, for example, U.S. Pat. No. 7,456,116, the entirety of which is incorporated herein by reference). The HARP™ process to form the dielectric gap fill layer 348 can be utilized to advantage, due to its excellent ability to fill in very narrow spaces between gates However, other oxide processes using high-density plasma (HDP), CVD, or plasma-enhanced CVD (PECVD), etc., can also be utilized. The thickness of the gap fill dielectric layer 348 will be, in one embodiment, from about 1600 Angstroms to about 3600 Angstroms.

A first CMP process (104 in FIG. 3) is then performed, followed by a dry etch ((105 in FIG. 3), to planarize the layers 346, 348 and remove the hardmask 324 on PMOS gates and the NMOS gates to expose a top portion of the polysilicon 320, leaving portions of the BTBAS layer 346 and gap fill dielectric layer 348 remaining between the PMOS and NMOS gates, as shown in FIG. 4L.

Figure 4N:
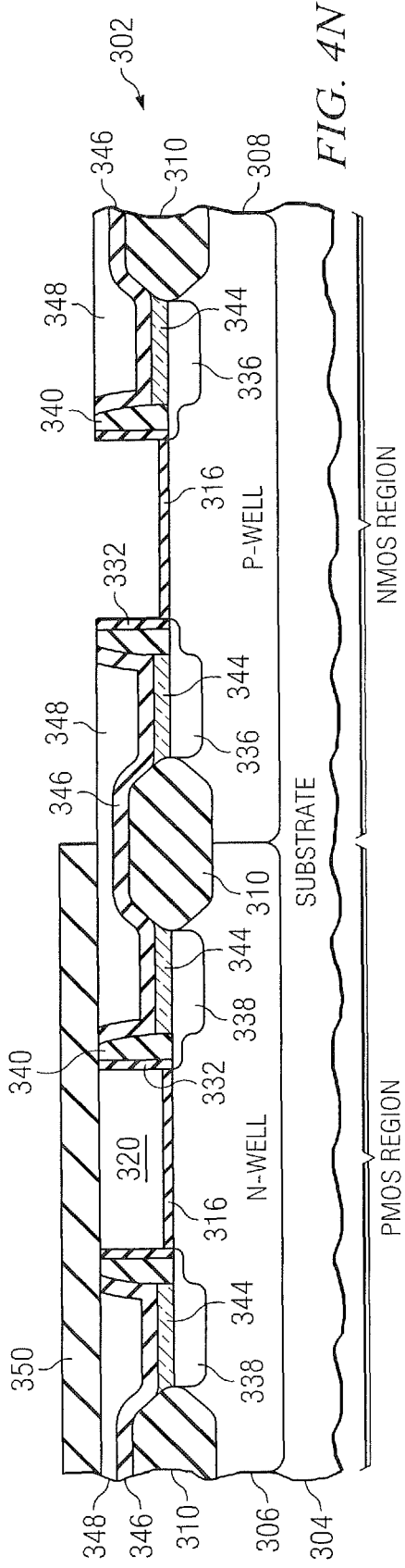

In FIG. 4M, a sacrificial nitride layer 350 is then deposited (106 in FIG. 3) over the PMOS and NMOS regions. The thickness of the sacrificial nitride layer 350 will, in one embodiment, be about 40 Angstroms. A mask 352 is then formed and patterned over the PMOS region (108 in FIG. 3), followed by removing the sacrificial nitride layer 350 and a portion of the polysilicon disposable gate layer 320 in the NMOS region by dry etching to prevent the undercut of the resist 352 in the PMOS region, followed by a short hydrofluoric acid and ammonium hydroxide wet etch (110 in FIG. 3) to remove the remaining portion of polysilicon 320 to form a cavity and expose the gate dielectric 316 in the NMOS region, as illustrated in FIG. 4N.

Figure 4O:
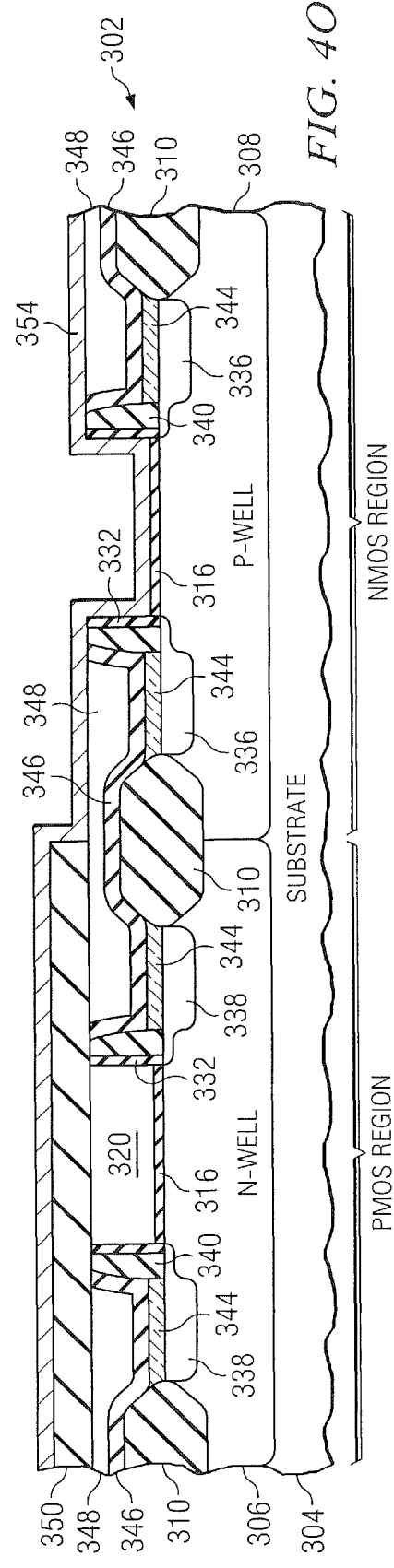

In FIG. 4O, an NMOS metal capping layer 354 is deposited (112 in FIG. 3) over the NMOS region and over the sacrificial nitride layer 350 in the PMOS region. The NMOS metal capping layer 354 will be, in one embodiment, a lanthanide series metal (e.g., lanthanum, cerium, praseodymium, neodymium, promethium, samarium, europium, gadolinium, ytterbium), etc. In one embodiment, the metal capping layer 354 will be lanthanum oxide. The thickness of the capping layer 354 will be, in one embodiment, from about less than 1 monolayer (ML) to about 20 Angstroms, and in one embodiment, about 10 Angstroms.

Figure 4P:
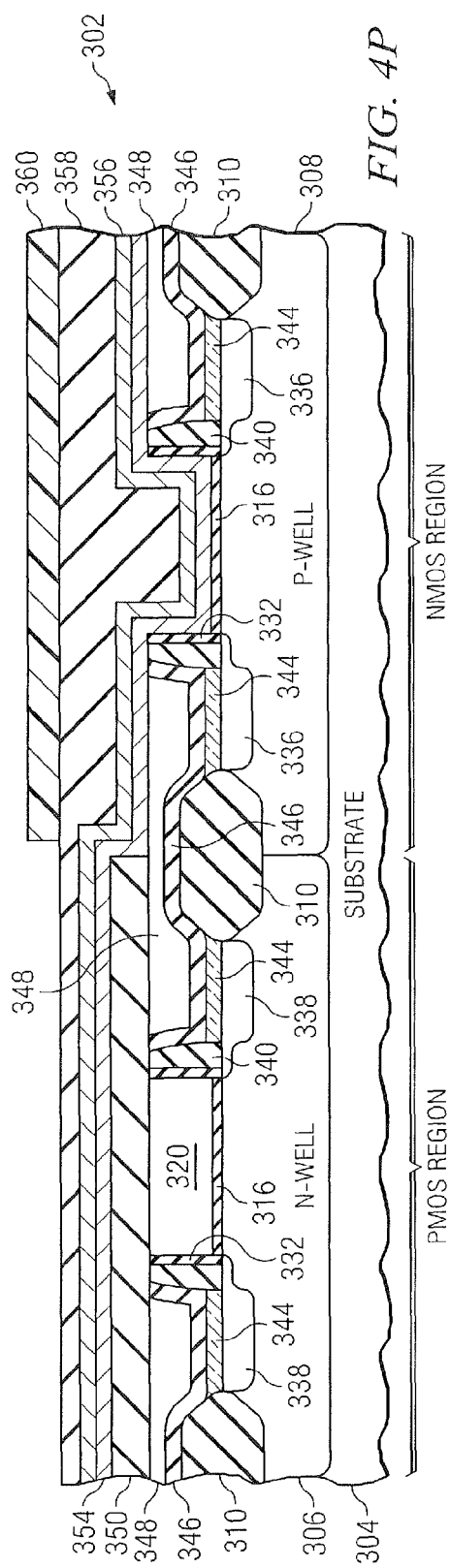

An NMOS first metal layer 356 is then deposited (114 in FIG. 3) over the metal capping layer 354 in FIG. 4P. First metal layer 356 can include, but is not limited to one or more metals containing nitrogen or metal alloys containing nitrogen, of any stoichiometry or relative concentrations of metal/metal alloy and nitrogen. The metal material may be formed using one or more metals, ternary metals, or metal alloys, such as, for example, those that include Ti, Ta, Hf, Zr, W, Mo, etc., including but not limited to metal nitrides $M_xN_y$, metal silicon nitrides $M_xSi_yN_z$, metal aluminum nitrides $M_xAl_yN_z$, and metal aluminum silicon nitrides $M_wAl_xSi_yN_z$ (where M is a metal, such as Ti, Ta, Hf, Zr, W, etc.), metal carbides, or pure metals such as Ti, Ta, Hg, Zr, Sc, Y, or equivalents, and be within the scope of the invention.

A first gap fill layer 358 of metal, such as one or more of W, Cu, or Al or equivalents thereof, is deposited (116 in FIG. 3) over NMOS first metal layer 356 in FIG. 4P. The gap fill layer 358 will be deposited to a thickness of about 400 Angstroms to about 2000 Angstroms, to overfill the gap left behind after removal of the preexisting disposable gate. In another embodiment, the gap fill layer 358 will be deposited following deposition of the metal replacement gates in both the NMOS and PMOS regions.

Figure 4Q:
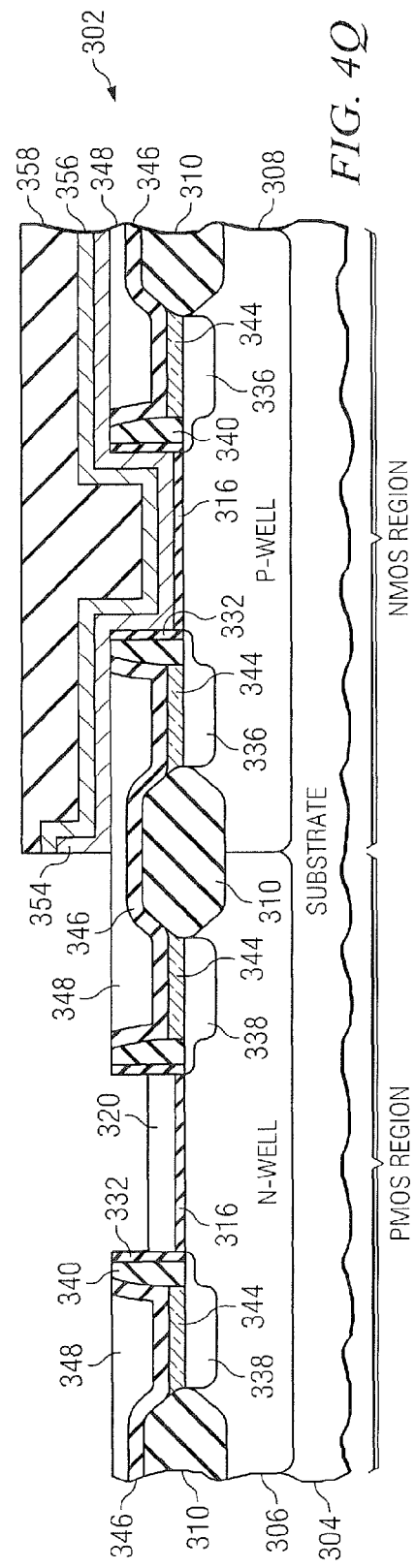

In FIG. 4Q, a mask 360 is then applied (118 in FIG. 3) and patterned to form a mask over the NMOS region, followed by a dry etch (120 in FIG. 3) of the gap fill layer 358, first metal layer 356, metal capping layer 354 and sacrificial nitride layer 350 in the PMOS region. The dry etch is followed by a short hydrofluoric acid and ammonium hydroxide wet etch (122 in FIG. 3) for removal of the polysilicon 320 disposable gate structure to form a cavity and exposure of the gate dielectric 316 in the PMOS region.

A PMOS second metal layer 362 is then deposited (124 in FIG. 3) over the PMOS and NMOS regions in FIG. 4R. The PMOS second metal layer 362 can include, in one embodiment, one or more materials such as Ru, W, Mo, tungsten nitride, carbonitrides, titanium carbonitride, tantalum carbonitride, oxynitrides, ruthenium oxide, TiAlN, TaCNO, and the like.

A second gap fill layer 364 is deposited (126 in FIG. 3) over the PMOS second metal layer 362 in FIG. 4R. The thickness of the second gap fill layer 364 will be, in one embodiment, from about 400 Angstroms to about 2000 Angstroms to overfill the gap left behind after removing the preexisting disposable gate. The second gap fill layer 364 may be the same material as set forth hereinabove with reference to the first gap fill layer 358.

Another CMP planarization process (128 in FIG. 3) is then utilized to remove portions of the layers 364, 362, 358, 356 and 354 down to the dielectric gap fill layer 348, followed by a dry and/or wet etch to remove remaining portions of the layer 348 and BTBAS layer 346, as shown in FIG. 4S, after which metallization and other back-end processing (130 in FIG. 3) is performed.

Although the invention has been illustrated and described with respect to one or more detailed implementations, those skilled in the art to which the invention relates will appreciate that alterations and/or modifications may be made to the illustrated examples without departing from the spirit and scope of the claimed invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description or the claims, such terms are intended to be inclusive in a manner similar to the term "comprising".

What is claimed is:

1. A method of fabricating an integrated circuit, including PMOS and NMOS replacement gate structures in a semiconductor device, the method comprising:
    forming disposable gate structures over a gate dielectric in PMOS and NMOS regions of a semiconductor body;
    forming a BTBAS layer over the disposable gate structures;
    planarizing the BTBAS layer to expose a top portion of the disposable gate structures;
    removing the disposable gate structures in the NMOS region to expose the gate dielectric in the NMOS region;
    forming an NMOS metal capping layer over the gate dielectric in the NMOS region;
    forming an NMOS first metal layer over the NMOS metal capping layer in the NMOS region;
    forming a conductive first gap fill layer over the NMOS first metal layer in the NMOS region;
    removing the disposable gate structure in the PMOS region to expose the gate dielectric in the PMOS region;
    forming a PMOS second metal layer over the gate dielectric in the PMOS region; and
    forming a conductive second gap fill layer over the PMOS second metal layer in PMOS region.

2. The method of claim 1, wherein disposable gate structures comprise polysilicon gate structures.

3. The method of claim 1, further comprising forming a dielectric gap fill layer over the BTBAS layer, wherein planarizing the BTBAS comprises planarizing both the dielectric gap fill layer and the BTBAS layer.

4. The method of claim 1, wherein the BTBAS layer is formed at a thickness of from about 20 Angstroms to about 100 Angstroms.

5. The method of claim 2, wherein the dielectric gap fill layer is formed at a thickness of from about 1600 Angstroms to about 3600 Angstroms.

6. The method of claim 1, wherein the NMOS metal capping layer comprises lanthanum oxide.

7. The method of claim 1, wherein the first and second gap fill layers comprise one or more of aluminum, tungsten, or copper.

8. The method of claim 1, wherein the PMOS second metal layer comprises one or more of Ru, W, Mo, tungsten nitride, carbonitrides, titanium carbonitride, tantalum carbonitride, oxynitrides or carbo-oxynitrides.

9. The method of claim 1, further comprising predoping the NMOS and PMOS regions with an n-type dopant following deposition of polysilicon.

10. The method of claim 1, wherein the first gap fill layer and second gap filler layer are deposited following deposition of the metal gates in both the NMOS and PMOS regions.

11. The method of claim 1, wherein the gate dielectric is a high-k gate dielectric.

12. A CMOS metal replacement gate structure made by the method of claim 1.

13. A method of fabricating an integrated circuit, including PMOS and NMOS replacement gate structures in a semiconductor device, the method comprising:
    forming disposable gate structures over a gate dielectric in both PMOS and NMOS regions;
    forming a BTBAS layer over the disposable gate structures in the PMOS and NMOS regions;
    planarizing the BTBAS layer, thereby exposing a top portion of the disposable gate structures in the PMOS and NMOS regions;

masking the PMOS region and then removing the disposable gate structure to form a cavity having a gate dielectric exposed therein at a bottom thereof in the NMOS region;

forming an NMOS metal capping layer over the exposed gate dielectric in the bottom of the cavity in the NMOS region;

forming an NMOS first metal layer over the NMOS metal capping layer in the cavity in the NMOS region;

forming a conductive first gap fill layer over the NMOS first metal layer thereby filling the cavity in the NMOS region;

masking the NMOS region and then removing the disposable gate structure to form a cavity having a gate dielectric exposed therein at a bottom portion thereof in the PMOS region;

forming a PMOS second metal layer over the gate dielectric in the PMOS region; and forming a conductive second gap fill layer over PMOS second metal layer in PMOS region.

14. The method of claim 13, further comprising forming a dielectric gap fill layer over the BTBAS layer, wherein planarizing the BTBAS comprises planarizing the dielectric gap fill layer and the BTBAS layer.

15. The method of claim 13, wherein the BTBAS layer is formed at a thickness of from about 20 Angstroms to about 100 Angstroms.

16. The method of claim 13, wherein the dielectric gap fill layer is formed at a thickness of from about 1600 Angstroms to about 3600 Angstroms.

17. The method of claim 13, wherein the NMOS metal capping layer comprises lanthanum oxide.

18. The method of claim 13, wherein the first and second gap fill layers comprise one or more of aluminum, tungsten, or copper.

19. A method of fabricating an integrated circuit, including PMOS and NMOS replacement gate structures in a semiconductor device, the method comprising:

forming polysilicon disposable gate structures having an insulative hardmask thereover over a gate dielectric in PMOS and NMOS regions of a semiconductor body, wherein the disposable gate structures define source/drain areas in the semiconductor body on opposing sides thereof;

forming source/drain regions in the source/drain areas in the PMOS and NMOS regions, respectively;

siliciding the source/drain regions in the PMOS and NMOS regions while the insulative hardmask prevents silicidation of the polysilicon gate structures in the PMOS and NMOS regions;

forming a BTBAS layer over the silicided source/drain regions and over the polysilicon disposable gate structures in the PMOS and NMOS regions;

planarizing the BTBAS layer to expose a top portion of the polysilicon disposable gate structures in the PMOS and NMOS regions;

masking the PMOS region and performing a dry etch to remove a first portion of the polysilicon disposable gate structure in the NMOS region;

performing a wet etch to remove a remaining portion of the polysilicon disposable gate structure in the NMOS region, thereby generating a cavity exposing the gate dielectric at a bottom portion thereof in the NMOS region, wherein the BTBAS layer protects underlying silicided source/drain regions in the NMOS region during the wet etch;

forming an NMOS metal capping layer over the exposed gate dielectric in the bottom of the cavity in the NMOS region;

forming an NMOS first metal layer over the NMOS metal capping layer in the cavity in the NMOS region;

forming a conductive first gap fill layer over the NMOS first metal layer thereby filling the cavity in the NMOS region;

masking the NMOS region and performing a dry etch to remove a first portion of the polysilicon disposable gate structure in the PMOS region;

performing a wet etch to remove a remaining portion of the polysilicon disposable gate structure in the PMOS region, thereby generating a cavity exposing the gate dielectric at a bottom portion in the PMOS region, wherein the BTBAS layer protects underlying silicided source/drain regions in the PMOS region during the wet etch;

forming a PMOS second metal layer over the gate dielectric in the PMOS region; and forming a conductive second gap fill layer over PMOS second metal layer in PMOS region.

20. The method of claim 19, wherein planarizing the BTBAS layer comprises:

performing a first chemical mechanical polish process followed by a dry etch to planarize the BTBAS layer and a gap fill dielectric layer and remove hardmask over the polysilicon gate structures in the PMOS and NMOS regions.

* * * * *